United States Patent [19]
Lee et al.

[11] Patent Number: 5,923,068
[45] Date of Patent: Jul. 13, 1999

[54] ELECTROSTATIC DISCHARGE PROTECTION DEVICE

[75] Inventors: Hyeok Jae Lee; Yun Jong Huh, both of Chungcheongbuk-do, Rep. of Korea

[73] Assignee: LG Semicon Co., Ltd., Cheongju, Rep. of Korea

[21] Appl. No.: 08/931,882

[22] Filed: Sep. 17, 1997

[30] Foreign Application Priority Data

Nov. 19, 1996 [KR] Rep. of Korea ...................... 96-55274

[51] Int. Cl.$^6$ .................................................. H01L 23/62
[52] U.S. Cl. .......................... 257/355; 257/360; 257/378
[58] Field of Search .................................... 257/355–361, 257/370, 378

[56] References Cited

U.S. PATENT DOCUMENTS

| | | |
|---|---|---|
| 4,896,243 | 1/1990 | Chatterjee et al. . |
| 5,012,317 | 4/1991 | Rountre . |
| 5,218,222 | 6/1993 | Roberts ................................... 257/362 |
| 5,329,143 | 7/1994 | Chan et al. ............................. 257/362 |
| 5,336,908 | 8/1994 | Roberts ................................... 257/355 |
| 5,440,151 | 8/1995 | Crevel et al. ........................... 257/362 |
| 5,576,557 | 11/1996 | Ker et al. ................................ 257/362 |
| 5,710,452 | 1/1998 | Narita ..................................... 257/355 |

OTHER PUBLICATIONS

Jeffrey T. Watt et al., "A Hot–Carrier Triggered SCR for Smart Power Bus ESD Protection;" 1995 IEEE Electron Device Letters, vol. 12, No. 1, Jan. 1991.

Chatterjee et al., "A Low–Voltage Triggering SCR for On–Chip ESD Protection at Output and Input Pads," IEEE Electron Device Letters, vol. 12, No. 1, Jan. 1991.

*Primary Examiner*—David B. Hardy
*Attorney, Agent, or Firm*—Fleshner & Kim

[57] ABSTRACT

Electrostatic discharge protection device is provided that protects the gate insulating layer without using an additional circuit to lower the trigger voltage of a thyristor. The electrostatic discharge protection device includes first and second impurity regions of a bipolar transistor being spaced a predetermined distance apart in a first conductivity type semiconductor substrate, and first and second impurity regions of a field transistor perpendicular to and along both sides of the first and second impurity regions of the bipolar transistor. A gate line formed between the first and second impurity regions of the bipolar transistor on the semiconductor substrate is coupled to one of the impurity regions of the field transistor. A Vss line is coupled to the other impurity region of the field transistor. The Vss line is also coupled to the first impurity region of the bipolar transistor. A metal layer is coupled to the first impurity region of the bipolar transistor and a pad.

22 Claims, 4 Drawing Sheets

ELECTROSTATIC DISCHARGE PROTECTION DEVICE

BACKGROUND OF THE INVENTION

1. Field of the Invention

The present invention relates to a semiconductor device and, more particularly, to an electrostatic discharge protection device suitable to protect a circuit of the semiconductor device from electrostatic discharge.

2. Background of the Related Art

Recently, as chip size becomes smaller, the size of an electrostatic discharge protection device also becomes smaller. However, with the advent of the highly integrated or high speed circuit, the capacity of static electricity generated around a junction of the electrostatic discharge protection circuit becomes a primary cause of RC delay.

When using a related art parasitic bipolar transistor as the electrostatic discharge protection circuit there is a limitation for maintaining protection from the static electricity while simultaneously reducing the junction static electricity capacity. In general, a field transistor is used for the related art parasitic bipolar transistor. However, a thyristor can discharge currents over two times greater than the bipolar transistor. Thus, a more efficient small junction area electrostatic discharge protection circuit is realized with the thyristor relative to the bipolar transistor.

In order to overcome the limitation, a method using the thyristor such as a Silicon Controlled Rectifier (SCR) was introduced in the U.S. patent application Ser. No. 4,896,243. This related art electrostatic discharge protection device uses the inner pressure of the well. As illustrated in FIG. 1, an N well 2 is formed on a first predetermined area of a P type substrate 1. The N well 2 is injected with a low density impurity material. In the N well 2, a high density first N$^+$ impurity region 3 and a first P$^+$ impurity region 4 are formed. On a second predetermined area of the P type substrate 1 outside the N well 2, a high density second N$^+$ impurity region 3a and a second P$^+$ impurity region 4a are formed. The electrostatic discharge protection circuit is illustrated in the form of an equivalent circuit in FIG. 2. The N well 2 of FIG. 1 corresponds to a first N layer 22. The first P$^+$ impurity region 4 of FIG. 1 is formed by impurity diffusion and corresponds to a first P layer 24 of FIG. 2. Accordingly, a PN junction is made by the first N layer 22 and the first P layer 24. The first P layer 24 is also connected to a pad (PAD). The second N$^+$ impurity region 3a of FIG. 1 corresponds to a second N layer 23 of FIG. 2, and thus, a PN junction is formed with the P type substrate 1 of FIG. 1. The second N$^+$ impurity region 3a and the second P$^+$ impurity region 4a are connected to a ground terminal or Vss.

In this electrostatic discharge protection device, if static electricity is applied as illustrated in FIG. 1, a breakdown occurs in the N well 2, and a carrier is injected to the P type substrate 1. The injected carrier goes into the junction of the P type substrate 1 and the second N$^+$ impurity region 3a to thereby operate an NPN bipolar transistor. At last, a PNPN path forms there so that the carriers applied are discharged due to the static electricity.

However, in the case where the silicon controlled rectifier uses the inner pressure of the well, because the trigger voltage is a high voltage of about 30–50 V, the gate insulating layer or the junction of the inner circuit may be broken before the electrostatic discharge protection element.

Accordingly, to lower the trigger voltage of the silicon controlled rectifier, another related art method uses the junction's inner pressure, not the well's inner pressure. As illustrated in FIG. 3, in the electrostatic discharge protection device using the junction's inner pressure, the inner pressure is about 10–15 V. However, when the thickness of the gate insulating layer is below 100 Å, the breakdown voltage of the gate insulating layer is about 12 V so that the junction's inner pressure and the gate insulating layer's breakdown voltage are almost the same. Accordingly, the characteristics of the gate insulating layer are decreased because of the static electricity. Further, this problem increases in the highly integrated circuits above 256 DRAM because the gate insulating layer is thinner.

To solve the gate insulating layer breakdown problem, a thyristor is used as the electrostatic discharge protection device and an additional trigger circuit can be formed. The additional trigger circuit generates a hot carrier when the static electricity is applied to lower the trigger voltage of the thyristor. The operation of a related art electrostatic discharge protection device using the thyristor and the hot carrier generating circuit is illustrated in FIG. 4. An earlier form of electrostatic discharge protection circuit for reinforcing the positive polarity (+) of Vcc with respect to Vss is an SCR made up with the bipolar transistors Q1 and Q2 using NPN and PNP. N-well and P-well resistances are respectively resistors $R_{NW}$ and $R_{PW}$ as illustrated in FIG. 4. The SCR is triggered in a low impedance state by the plate current that has a hot carrier injected from NMOS transistor M1 connected to the base of the Q1. Transistors M2–M5 control the trigger of the SCR according to the variation of the trigger variation M1, and allow the generation of the hot carrier only during the generation of electrostatic discharge (ESD). The transistor M2 coupled with the gate of M1 supplys Vcc power and thus is connected as the capacitor. The gate of the transistor M1 is discharged as Vss by the turn-on of the transistor M3 according to the turn-on of the transistor M5. The geometrical structure of the transistors M2 and M3 is used for guaranteeing a gate voltage Vgate larger than the voltage of the NMOS FET during the generation of ESD. In the operation of the electrostatic discharge protection circuit using the hot carrier generation circuit, the transistor M3 prevents the trigger of SCR and forms the gate voltage Vgate of M1 according to the Vss. Further, transistor M4 is used as the ESD clamp to limit the voltage crossing the gate oxide layer of M2.

However, these related art electrostatic discharge protection methods using the hot carrier still have various disadvantages.

First, as the device operates at a high speed when using the inner pressure of the junction, the gate insulating layer gets thinner. Accordingly, the insulating layer's inner pressure is lowered. However, the junction's inner pressure is not lowered. Therefore, the static electricity cannot be prevented using the junction's inner pressure.

Second, when using the hot carrier, if the static electricity is accumulated by the degradation of the circuit itself because of the hot carrier generation, the trigger circuit does not operate exactly.

Third, the additional circuit that generates the hot carrier complicates the structure and increases costs.

The above references are incorporated by reference herein where appropriate for appropriate teachings of additional or alternative details, features and/or technical background.

SUMMARY OF THE INVENTION

An object of the present invention is to substantially obviate one or more of the problems caused by limitations and disadvantages of the related art.

Another object of the present invention is to provide an electrostatic discharge protection device that protects an inner circuit from the static electricity.

A further object of the present invention is to provide an electrostatic discharge protection device that does not damage the gate insulating layer without using an additional circuit to lower the trigger voltage of a thyristor.

To achieve these and other objects and advantages in whole or in part and in accordance with the purpose of the present invention, as embodied and broadly described, the electrostatic discharge protection device of the invention includes a second conductivity type first and second impurity regions formed on both sides of a first conductivity type impurity region on a first conductivity type semiconductor substrate; a second conductivity type well under the impurity regions; a second conductivity type third impurity region formed on a predetermined area excluding and spaced apart from the second conductivity type well; a gate line formed on the first conductivity type semiconductor substrate between the second conductivity type first and third impurity regions; a metal layer formed on the second conductivity first, second and third impurity regions and the first conductivity type impurity region; a second conductivity type fourth and fifth impurity regions interposing a device isolating layer perpendicular to the second conductivity type first, second and third impurity regions and formed along one end; and a second conductivity type sixth and seventh impurity regions formed along the other end perpendicular to the second conductivity type first, second and third impurity regions.

Additional advantages, objects, and features of the invention will be set forth in part in the description that follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Preferred embodiments of the present invention will now be described with reference FIGS. 5–7.

Figure 1:
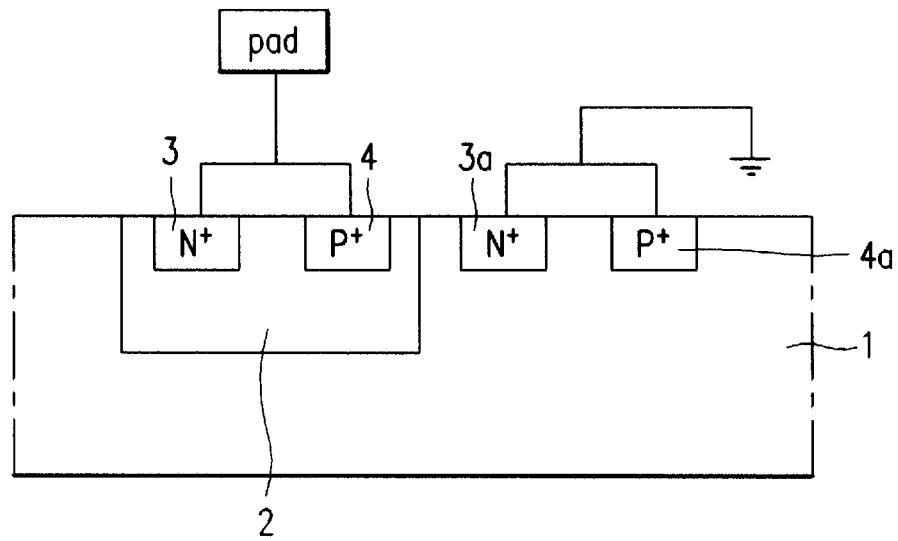
FIG. 1 is a diagram showing a sectional view of a related art electrostatic discharge protection device.
Figure 2:
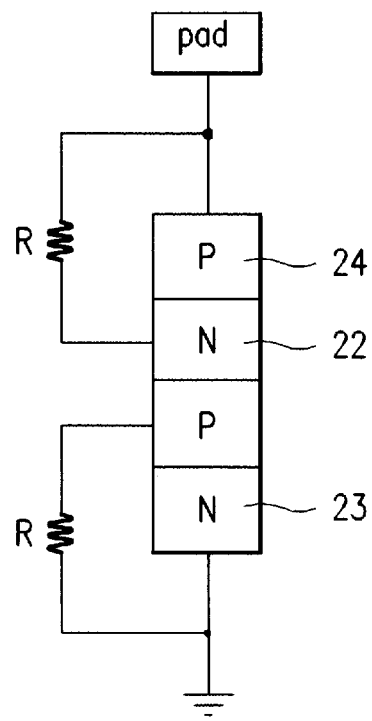
FIG. 2 is a circuit diagram showing the device of FIG. 1.
Figure 3:
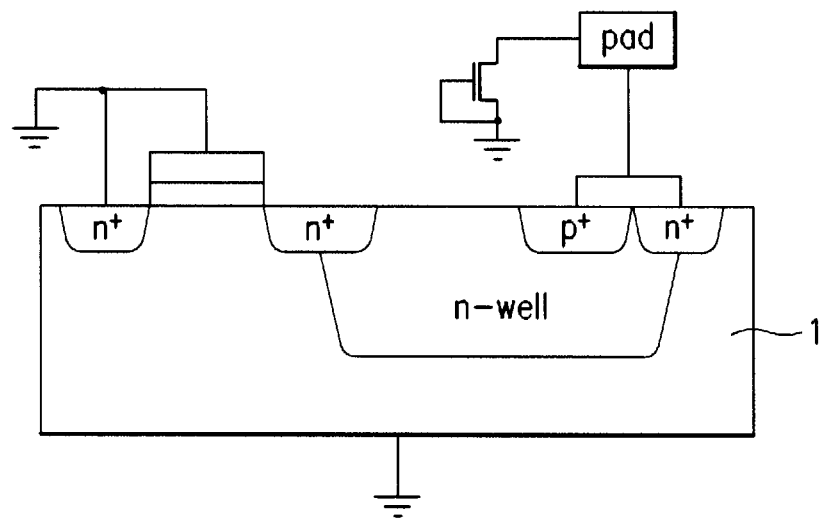
FIG. 3 is a diagram showing a sectional view of a related art electrostatic discharge protection device using an inner pressure at the junction.
Figure 4:
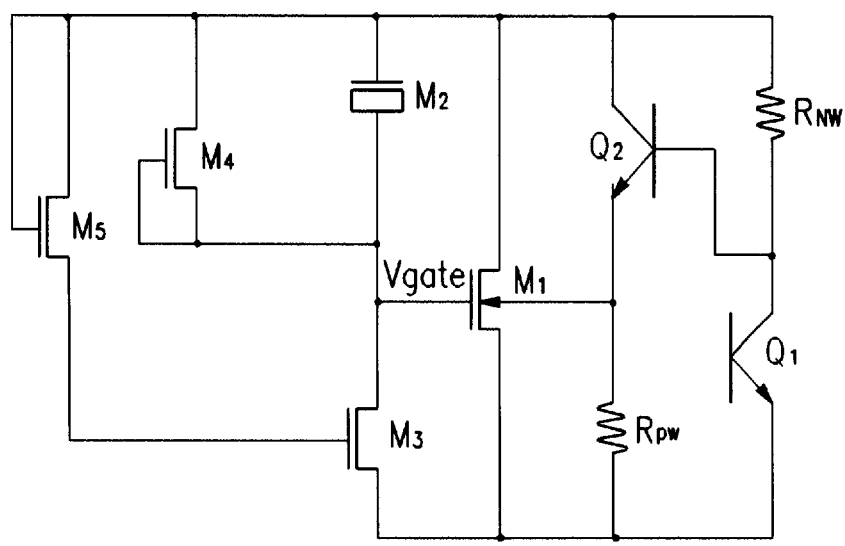
FIG. 4 is a circuit diagram showing a related art electrostatic discharge protection device using a hot carrier.
Figure 5:
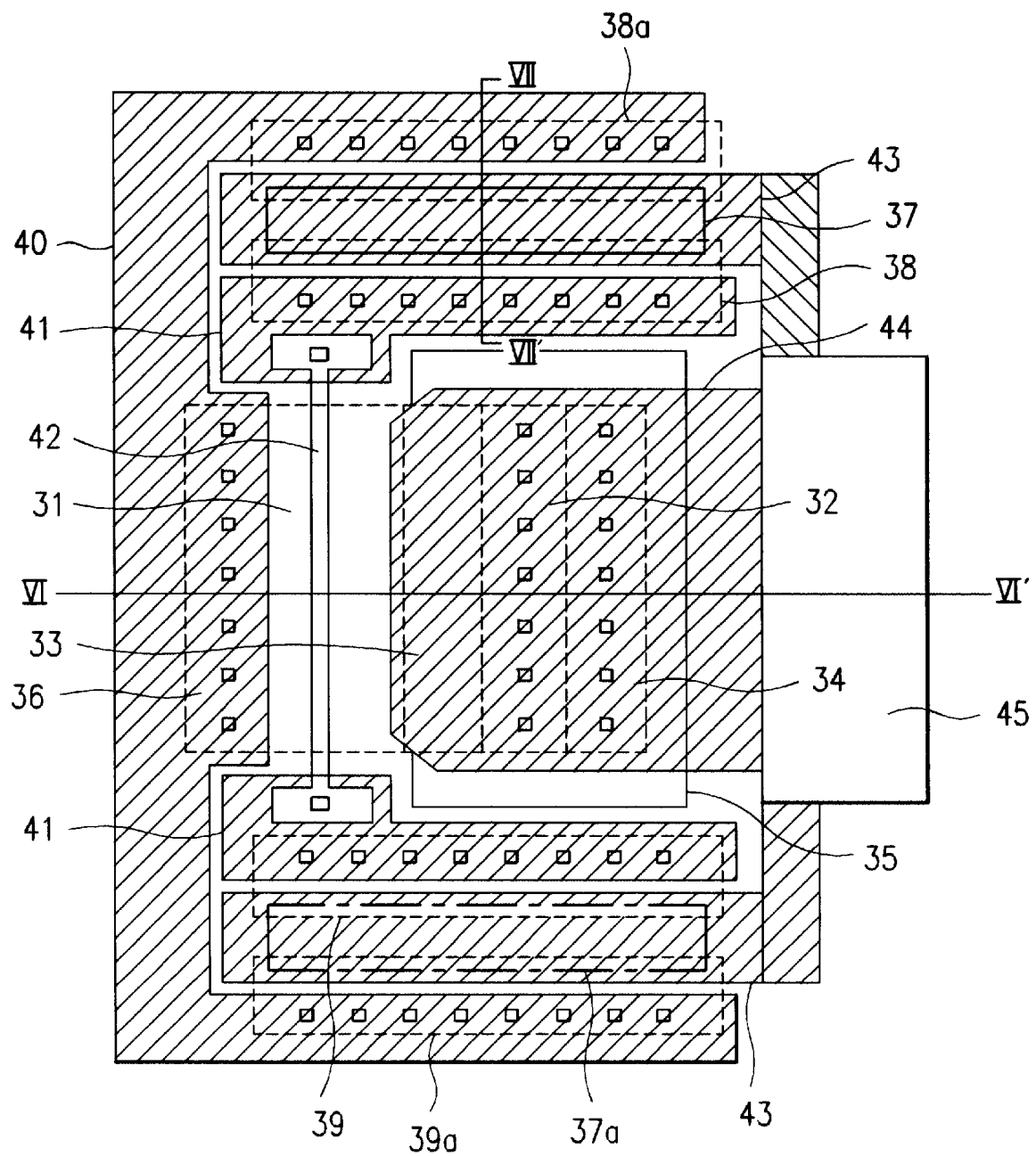
FIG. 5 is a diagram showing an electrostatic discharge protection device according to an embodiment of the present invention.

As illustrated in FIG. 5, a first preferred embodiment according to the invention includes a second conductivity type first and second impurity regions 33 and 34 formed on both sides of a first conductivity type impurity region 32 on a first conductivity type semiconductor substrate 31. A second conductivity type well 35 is formed under the impurity regions 32–34 so that one side surrounds the second conductivity type second impurity region 34 and the other side extends to a first predetermined area of the first conductivity type semiconductor substrate 31. A second conductivity type third impurity region 36 is formed on a second predetermined area of the substrate 31 exclusive of and spaced apart from the second conductivity type first impurity region 33.

A second conductivity type fourth and fifth impurity regions 38 and 38a interposing a first device isolating layer 37 are perpendicular to the respective impurity regions 32–34, 36 and formed along one side of the impurity regions 32–34, 36. The same structure including second conductivity type sixth and seventh impurity regions 39 and 39a interposing a second device isolating layer 37a is perpendicular to the respective impurity regions 32–34, 36 along the opposite side and faces the second conductivity type fourth and fifth impurity regions 38 and 38a.

A first metal layer 40 is formed on the second conductivity type third, fifth and seventh impurity regions 36, 38a and 39a and respectively coupled thereto through contact holes. A second metal layer 41 is formed on the second conductivity type fourth and sixth impurity regions 38 and 39 and coupled thereto through contact holes. A gate line 42 is respectively coupled to the second metal layer 41 on the fourth impurity region 38 and on the sixth impurity region 39 through a contact hole. The gate line 42 is formed on the substrate 31 between the second conductivity type first and third impurity regions 33 and 36. A third metal layer 43 is formed on the first and second device isolating layers 37 and 37a. A fourth metal layer 44 is formed on the second conductivity type first and second impurity regions 33 and 34 and the first conductivity type first impurity region 32. A pad 45 is electrically coupled to the third and fourth metal layers 43 and 44. The first conductivity type first impurity region 33 is not coupled to the fourth metal layer 44, however the second conductivity type second impurity region 34 and the first conductivity type first impurity region 32 are coupled to the fourth metal layer 44 through contact holes.

A bipolar transistor is implemented by the first conductivity type first impurity region 32 and the second conductivity type first and second impurity regions 33 and 34. The first metal layer 40 is used as a Vss line for applying the power voltage. Accordingly, a field transistor is implemented by the second conductivity type fourth impurity region 38, the gate line 42 coupled to the second conductivity type fourth impurity region 38, and the second conductivity type fifth impurity region 38a. As illustrated in FIGS. 6–7, the first conductivity type is P conductivity type and the second conductivity type is N conductivity type.

Figure 6:
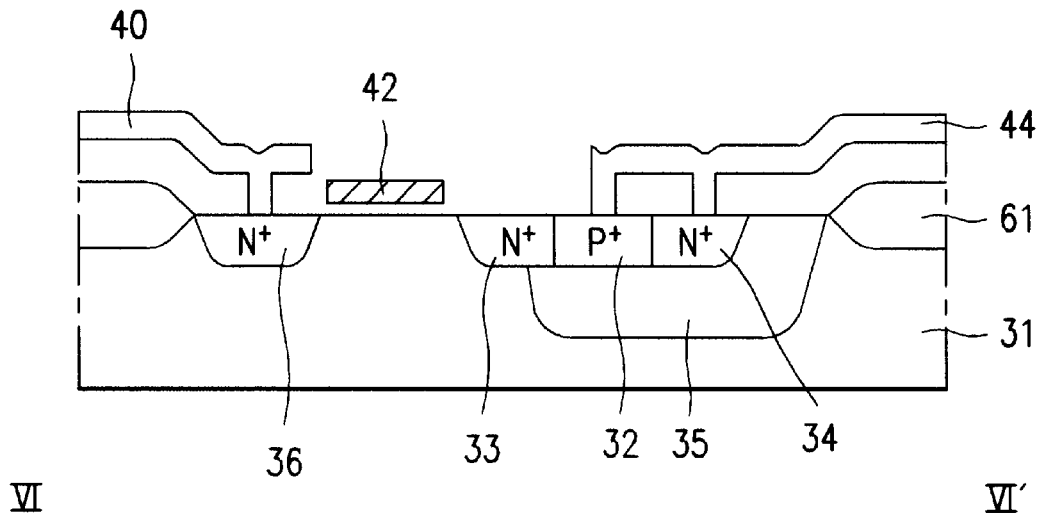
FIG. 6 is a diagram showing a sectional view of FIG. 5 along line VI—VI'.

As illustrated in FIG. 6, the electrostatic discharge protection device includes the second conductivity type well 35 formed on a predetermined part of the first conductivity type semiconductor substrate 31 having an active region defined by a field oxide layer 61. The second conductivity type first impurity region 33 interposing the first conductivity type first impurity region 32 is formed with one side adjacent to the first predetermined area of the first conductivity type semiconductor substrate 31, and another side is coupled to the second conductivity type well 35. The second conductivity type second impurity region 34, which is on the other side of the first conductivity type first impurity region 32.

The second conductivity type third impurity region 36 that is spaced apart from the second conductivity type first impurity region 33. The gate line 42 formed on the first conductivity type semiconductor substrate 31 between the second conductivity type first and third impurity regions 33 and 36, has the insulating layer on its center. The electrostatic discharge protection device further includes the Vss line 40 electrically coupled to the second conductivity type third impurity region 36, and the metal layer 44 coupled to the first conductivity type first impurity region 32 and the second conductivity type second impurity region 34 through the respective contact holes. As illustrated in FIG. 6, the bipolar transistor is implemented by the gate line 42, and each of impurity regions 32,33,34,36. The second conductivity type third impurity region 36 is coupled with the Vss line 40.

Figure 7:
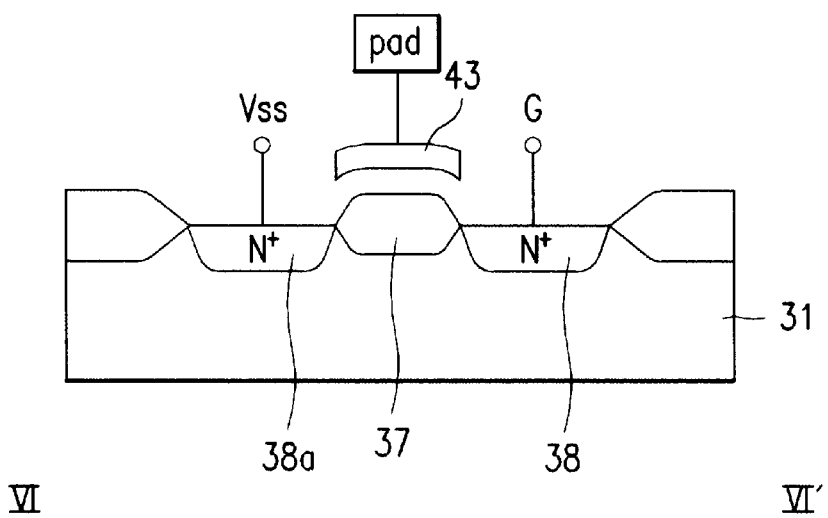
FIG. 7 is a diagram showing a sectional view of FIG. 5 along line VII—VII'.

As illustrated in FIG. 7, the first preferred embodiment includes: the first conductivity type semiconductor substrate 31, the second conductivity type fourth and fifth impurity regions 38 and 38a formed on a predetermined portion of the substrate 31 with the device isolating layer 37 in the center, the third metal layer 43 formed on the device isolating layers 37 and 37a and electrically coupled to the pad 45, the Vss line coupled to the second conductivity type seventh impurity region 39a through the contact hole, and the second metal layer 41 electrically coupling the second conductivity type sixth impurity region 39 and the gate line 42.

Operations of the first preferred embodiment of the electrostatic discharge protection device will now be described.

Once the static electricity is applied through the pad 45, the breakdown voltage of the gate electrode 42 of the bipolar transistor coupled to the field transistor is induced according to the coupling rate of the capacitance of the field transistor and the gate capacitance of the bipolar transistor. Accordingly, the bipolar transistor operates at a voltage lower than the voltage taken to couple the gate electrode 42 of the bipolar transistor to the ground. In other words, this causes the same effect as lowering the BVDSS by inducing a predetermined voltage to the gate electrode. Therefore, the bipolar transistor is operated at the low voltage.

As described above, the gate electrode 42 of the bipolar transistor is not coupled to the power source terminal, but to the field transistor. Therefore, if the static electricity is applied, a predetermined voltage is applied to the gate. That is, the operational voltage of the parasitic bipolar transistor is measured by measuring the snap back voltage, when evaluating the transistor characteristics. In general, the snap back voltage is lower than the BVDSS voltage, so that the static electricity can be effectively removed. The present invention synchronizes the thyristor to thereby lower the operational voltage below 10 V, so that the first preferred embodiment can be applied to processes where the oxide layer's thickness is below 100 Å.

Accordingly, the first preferred embodiment of an electrostatic discharge protection device has the effects as follows.

The electrostatic discharge protection device according to this invention needs no additional circuit for lowering the synchronization voltage of the thyristor so that the layout design is simplified relative to related art circuits. Further, the circuit degradation characteristic is improved.

When using the active circuit for lowering the synchronization voltage of the thyristor, the additional electrostatic discharge protection circuit for lowering the BVDSS voltage is not required.

Further, the electrostatic discharge protection device can be used in a process in which the thickness of the gate oxide layer is below 100 Å without the variation of the process.

It is to be understood that both the foregoing general description and the following detailed description are exemplary and explanatory. It will be apparent to those skilled in the art that various modifications can be made in the electrostatic discharge protection device of the present invention without departing from the spirit or scope of the invention. It is intended that the present invention cover the modifications and variations of this invention that are within the scope of the appended claims and their equivalents.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An electrostatic discharge protection device, comprising:
    first and second impurity regions of a bipolar transistor, the first and second regions being spaced apart at a predetermined distance in a semiconductor substrate;
    first and second impurity regions of a field transistor, the first and second impurity regions of the field transistor being perpendicular to and along opposing ends of the first and second impurity regions of the bipolar transistor, wherein each of the first and second impurity regions of the field transistor interpose a first insulating layer;
    a gate line coupled to one of the first and second impurity regions of the field transistor and formed between the first and second impurity regions of the bipolar transistor on the semiconductor substrate;
    a Vss line coupled to the other of the first and second impurity regions of a field transistor and the first impurity region of the bipolar transistor; and
    a first metal layer coupled to the first impurity region of the bipolar transistor and for coupling to a pad.

2. The electrostatic discharge protection device of claim 1, wherein the first impurity region of the bipolar transistor comprises two second conductivity type impurity regions interposing a first conductivity type impurity region.

3. The electrostatic discharge protection device of claim 1, further comprising the pad coupled to the first metal layer.

4. The electrostatic discharge protection device of claim 3, further comprising a second metal layer is formed on the insulating layer of the field transistor, the second metal layer being coupled to the pad.

5. The electrostatic discharge protection device of claim 1, wherein the gate line is coupled to said one of the first and second impurity regions of the field transistor with a third metal layer.

6. The electrostatic discharge protection device of claim 1, wherein the semiconductor substrate is a first conductivity type semiconductor substrate.

7. The electrostatic discharge protection device of claim 1, wherein a second conductivity type well is formed under the first impurity region of the bipolar transistor.

8. The electrostatic discharge protection device of claim 1, wherein the first conductivity type is P conductivity type.

9. The electrostatic discharge protection device of claim 1, wherein the impurity regions of the field transistor are N conductivity type and the first insulating layer is P type.

10. The electrostatic discharge protection device of claim 1, wherein the field transistor comprises:
    a first conductivity type portion of the semiconductor substrate having an active region determined by a device isolating layer;

wherein the first and second impurity regions are a second conductivity type and formed on the active region;

the Vss line coupled to the second conductivity type first impurity region;

the gate line coupled to the second conductivity type second impurity region;

a second metal layer formed on the first insulating layer between the second conductivity type first and second impurity regions; and the pad coupled with the second metal layer.

11. The electrostatic discharge protection device of claim 1, wherein the bipolar transistor comprises:

a second conductivity type well formed on a predetermined area in the semiconductor substrate having an active region determined by a field oxide layer, wherein the second impurity region is formed in the well, the second impurity region comprising;

a first conductivity type first impurity area, a second conductivity type first impurity area interposing the first conductivity type first impurity area in the second conductivity type well, wherein the second conductivity type first impurity area has one side coupled to a predetermined part of the semiconductor substrate, and the other side coupled to the second conductivity type well, and a second conductivity type second impurity area on the other side of the first conductivity type first impurity area in the second conductivity type well;

the first impurity region is a second conductivity type and spaced apart from the second conductivity type first impurity area in the predetermined part of the semiconductor substrate;

the gate line formed on the semiconductor substrate between the second conductivity type first and third impurity regions;

the Vss line coupled to the second conductivity type first impurity region; and the first metal layer formed on the first conductivity type first impurity area and the second conductivity type second impurity area to be coupled thereto through respective contact holes.

12. The electrostatic discharge protection device of claim 11, wherein the gate line has a second insulating layer formed on its center.

13. The electrostatic discharge protection device of claim 1, wherein the thickness of a gate oxide layer is below 100 Å for the gate line.

14. The electrostatic discharge protection device of claim 1, wherein an operational voltage of the bipolar transistor is below 10V.

15. An electrostatic discharge protection device, comprising:

a pad;

a bipolar transistor in a semiconductor substrate;

first and second field transistors being perpendicular to and along opposing ends of the bipolar transistor;

a gate line coupled to the field transistors on the semiconductor substrate;

a Vss line coupled to the field transistors and the bipolar transistor; and a first metal layer coupled to the bipolar transistor and for coupling to the pad.

16. The electrostatic discharge protection device of claim 15, wherein each of the field transistors comprises:

the semiconductor substrate being a first conductivity type and having an active region determined by a device isolating layer;

second conductivity type first and second impurity regions formed on the active region interposing a first insulating region;

the Vss line coupled to the second conductivity type first impurity region;

the gate line coupled to the second conductivity type second impurity region; and a second metal layer formed on the first insulating region between the second conductivity type first and second impurity regions and coupled to the pad.

17. The electrostatic discharge protection device of claim 15, wherein the bipolar transistor comprises:

a second conductivity type well formed on a predetermined area in the semiconductor substrate having an active region determined by a field oxide layer, wherein the semiconductor substrate is a first conductivity type;

a second conductivity type first impurity region interposing a first conductivity type first impurity region in the second conductivity type well, wherein the second conductivity type first impurity region has one side coupled to a predetermined part of the semiconductor substrate, and the other side is coupled to the second conductivity type well;

a second conductivity type second impurity region on the other side of the first conductivity type first impurity region in the second conductivity type well;

a second conductivity type third impurity region spaced apart from the second conductivity type first impurity region;

the gate line formed on the first conductivity type semiconductor substrate between the second conductivity type first and third impurity regions;

the Vss line coupled to the second conductivity type third impurity region; and the first metal layer formed on the first conductivity type first impurity region and the second conductivity type second impurity region to be coupled thereto through respective contact holes.

18. The electrostatic discharge protection device of claim 16, wherein the thickness of a gate oxide layer is below 100 Å.

19. The electrostatic discharge protection device of claim 16, wherein an operational voltage of the bipolar transistor is below 10V.

20. An electrostatic discharge protection device, comprising:

first and second impurity regions of a first transistor, the first and second regions being spaced apart at a predetermined distance in a first conductivity type portion of a semiconductor substrate;

first and second impurity regions of a second transistor, the first and second impurity regions of the second transistor being adjacent to and along the first and second impurity regions of the first transistor, wherein each of the first and second impurity regions of the second transistor interpose an insulating layer;

a first conductive layer coupled to one of the first and second impurity regions of the second transistor; and a second conductive layer coupled to the other of the first and second impurity regions of a second transistor and the first impurity region of the first transistor; and a first metal layer coupled to the first impurity region of the first transistor and for coupling to a pad, wherein the first conductive layer is a gate line formed between the first and second impurity regions of the first transistor, and wherein the second conductive layer is a supply voltage line.

21. The electrostatic discharge protection device of claim 20, wherein the first and second impurity regions of the second transistor are perpendicular to and along opposing ends of the first and second impurity regions of the first transistor.

22. The electrostatic discharge protection device of claim 20, wherein the first and second transistors are a bipolar transistor and a field transistor, respectively.

* * * * *